(12) United States Patent
Li

(10) Patent No.: US 11,978,667 B2
(45) Date of Patent: May 7, 2024

(54) METHOD FOR MANUFACTURING WIRE LAYER

(71) Applicant: CHANGXIN MEMORY TECHNOLOGIES, INC., Anhui (CN)

(72) Inventor: Kaixuan Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 429 days.

(21) Appl. No.: 17/400,549

(22) Filed: Aug. 12, 2021

(65) Prior Publication Data

US 2021/0375673 A1 Dec. 2, 2021

Related U.S. Application Data

(63) Continuation of application No. PCT/CN2021/076097, filed on Feb. 8, 2021.

(30) Foreign Application Priority Data

Feb. 27, 2020 (CN) .......................... 202010123283.4

(51) Int. Cl.
  *H01L 21/768* (2006.01)
  *H01L 23/532* (2006.01)

(52) U.S. Cl.
  CPC .. *H01L 21/76882* (2013.01); *H01L 23/53214* (2013.01)

(58) Field of Classification Search
  CPC ......... H01L 21/76882; H01L 23/53214; H01L 21/76877; H01L 21/76883
  See application file for complete search history.

(56) References Cited

U.S. PATENT DOCUMENTS

| 5,552,341 | A | 9/1996 | Lee |
| 5,939,787 | A | 8/1999 | Lee |
| 7,816,255 | B2 | 10/2010 | Choi |
| 2008/0274610 | A1 | 11/2008 | Choi |

FOREIGN PATENT DOCUMENTS

| CN | 1090091 | A | | 7/1994 | |
| CN | 101399220 | A | | 4/2009 | |
| CN | 101431049 | A | | 5/2009 | |
| CN | 107946233 | A | | 4/2018 | |
| CN | 110112094 | A | | 8/2019 | |
| GB | 2253939 | A | * | 9/1992 | ........ H01L 21/32115 |

OTHER PUBLICATIONS

International Search Report in the international application No. PCT/CN2021/076097, dated Apr. 26, 2021, 2 pgs.

\* cited by examiner

*Primary Examiner* — Samuel A Gebremariam
(74) *Attorney, Agent, or Firm* — Cooper Legal Group, LLC

(57) ABSTRACT

Some examples of the present disclosure provide a method for manufacturing a wire layer. The method for manufacturing a wire layer includes steps in which a wafer having an opening is provided; conductive grains are deposited on the wafer, and on a bottom and a side wall of the opening to form a conductive film, during which a temperature of a surface of the wafer is lower than a flowing temperature of the conductive film, and when the temperature of the surface of the wafer is greater than or equal to the flowing temperature, the conductive film starting to flow; and after the conductive film is formed, the temperature of the surface of the wafer is elevated to perform a reflowing process, such that the conductive film is converted to a conductive layer filling up the opening.

15 Claims, 10 Drawing Sheets

METHOD FOR MANUFACTURING WIRE LAYER

CROSS-REFERENCE TO RELATED APPLICATIONS

The present disclosure is a continuation application of International Application No. PCT/CN2021/076097, filed on Feb. 8, 2021, which claims the benefit of priority of Chinese Patent Application No. 202010123283.4, filed on Feb. 27, 2020. International Application No. PCT/CN2021/076097 and Chinese Patent Application No. 202010123283.4 are entitled "METHOD FOR MANUFACTURING WIRE LAYER". International Application No. PCT/CN2021/076097 and Chinese Patent Application No. 202010123283.4 are hereby incorporated by reference in their entireties.

TECHNICAL FIELD

The present disclosure relates to the technical field of semiconductor manufacture, and more particularly, to a method for manufacturing a wire layer.

BACKGROUND

Aluminum metal has the advantages such as relatively low resistance value, readily available, cheap, readily being dry etched and the like, therefore it is widely used as a metal wire in the semiconductor industry. The melting point of the aluminum metal is greater than 660° C., but aluminum begins to present a molten state when its temperature reaches 330° C. (that is, half of the melting point, also referred to as a semi-melting point). Since aluminum has reflowing characteristics at a high temperature, it is commonly used for hole-filling of the metal wire.

Processes commonly used for aluminum include a heating evaporation process, a reflowing process, a sputtering process and the like.

SUMMARY

Some examples of the present disclosure provide a method for manufacturing a wire layer, which is advantageous to reduce the generation of defects such as edge protrusion or the like.

In order to solve the above problem, some examples of the present disclosure provide a method for manufacturing a wire layer, including the steps that: a wafer having an opening is provided; conductive grains are deposited on the wafer, and a bottom and a side wall of the opening to form a conductive film, in which during deposition of the conductive grains, a temperature of a surface of the wafer is lower than the flowing temperature of the conductive film, and when the temperature of the surface of the wafer is greater than or equal to the flowing temperature, the conductive film starts to flow; and after the conductive film is formed, the temperature of the surface of the wafer is elevated to perform a reflowing process, such that the conductive film is converted to a conductive layer filling up the opening.

BRIEF DESCRIPTION OF THE DRAWINGS

One or more examples are exemplarily described with the figures in the corresponding accompanying drawings. These exemplary descriptions are not to be construed as limiting the examples. The elements with the same reference sign in the accompanying drawings represent similar elements. Unless otherwise specified, the figures in the accompanying drawings do not form scale limits.

DETAILED DESCRIPTION

Figure 1:
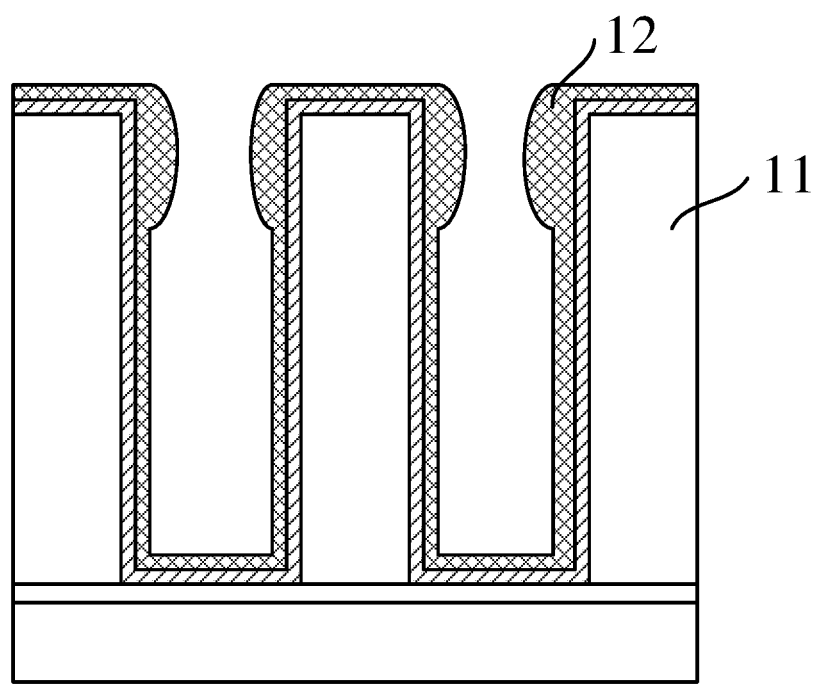
FIG. 1 to FIG. 3 are schematic sectional structure diagrams corresponding to each of the steps of a method for manufacturing a wire layer.
Figure 2:
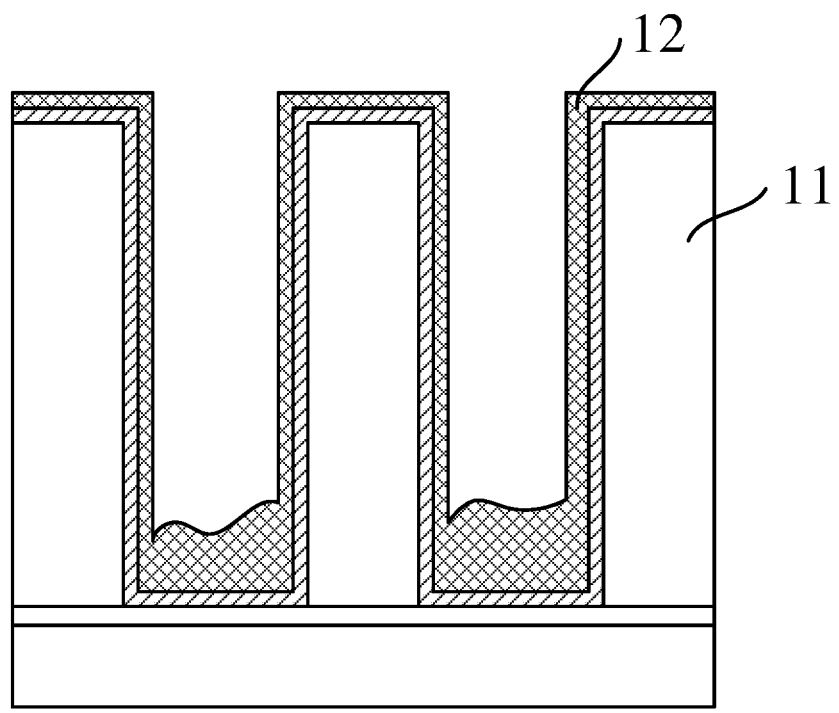
Figure 3:
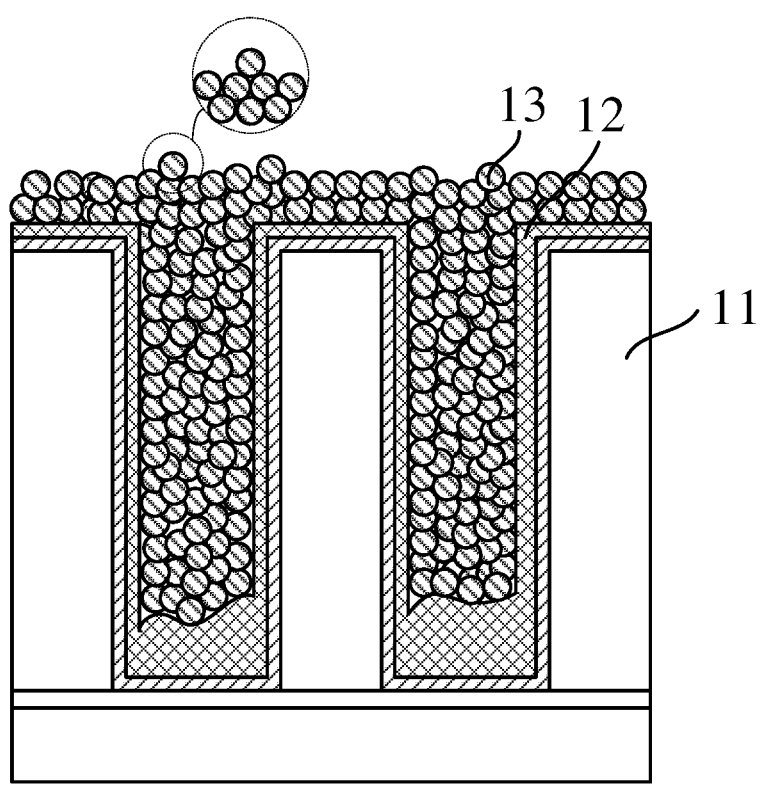

FIG. 1 to FIG. 3 are schematic sectional structure diagrams corresponding to each steps of a method for manufacturing a wire layer. Referring to FIG. 1 to FIG. 3, a method for manufacturing an aluminum wire includes the following steps.

As shown in FIG. 1, before performing a physical vapor deposition process, a layer of cold aluminum 12 is deposited on a wafer 11. Since when a deposition process of the cold aluminum 12 is performed, the temperature of the wafer 11 is relatively low, grains of the deposited cold aluminum 12 are relatively small, and the effect of improving the reflowing efficiency is achieved.

As shown in FIG. 2, the wafer 11 is heated so that the temperature of a surface of the wafer 11 is greater than the point that aluminum begins to present a molten state. That is, the temperature of the surface of the wafer 11 reaches 350° C.-400° C., and the cold aluminum 12 located on the surface of the wafer 11 reflows. Under an ideal condition, the reflowed cold aluminum 12 still covers the wafer 11, and a bottom and a side wall of an opening.

It is to be noted that the deposition of the cold aluminum 12 and the heating of the wafer 11 need to be performed in two different chambers.

As shown in FIG. 3, in the case that the temperature of the surface of the wafer 11 reaches a preset temperature, the aluminum grains are generated by impacting an aluminum target material with plasmas, and the aluminum grains are deposited on the surface of the wafer 11 to form an aluminum film 13. This step is commonly named as hot aluminum deposition. Since in the procedure of forming the aluminum film 13, the temperature of the surface of the wafer 11 is relatively high and the plasmas also impact the deposited aluminum grains, the aluminum grains in the deposited aluminum film 13 have a relatively large size, and the aluminum grains with the large size are mutually squeezed, thereby forming defects such as edge protrusions and whiskers, etc.

Figure 4:
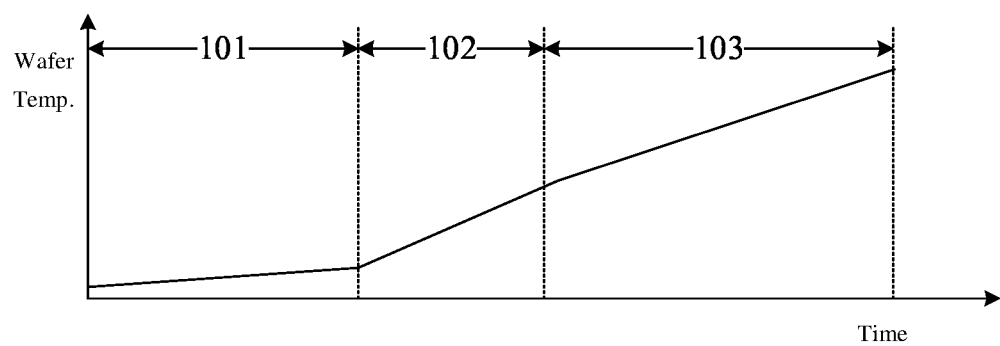
FIG. 4 is a wafer temperature variation diagram corresponding to a method for manufacturing a wire layer.

FIG. 4 is a wafer temperature variation diagram corresponding to a manufacturing method of a wire layer.

Referring to FIG. 1 and FIG. 4, the wafer temperature variation diagram includes a cold aluminum deposition stage 101, a wafer-heating stage 102, and a hot aluminum deposition stage 103. In the cold aluminum deposition stage 101, aluminum grains generated by plasmas impacting have the temperature higher than the aluminum target material, thus the aluminum grains with the elevated temperature are deposited on the wafer 11 which is still in at an ambient temperature, so that the temperature of the wafer 11 is slightly elevated. In the wafer-heating stage 102, the surface of the wafer 11 is heated to enable the temperature of the surface of the wafer 11 to reach the temperature that the aluminum grains melt. In the hot aluminum deposition stage 103, the plasmas impact the surface of the wafer 11, such that the temperature of the surface of the wafer 11 is further elevated, and the temperature of the wafer 11 may exceed a tolerable range of the wafer 11 due to the random impact of the plasmas, thereby causing damage to the performance of the wafer 11.

In order to solve the above problems, the examples of the present disclosure provide a method for manufacturing a wire layer, including the following steps. A wafer having an opening is provided. The conductive grains are deposited on the wafer and on the bottom and a side wall of the opening to form a conductive film. During deposition of the conductive grains, the temperature of the wafer is lower than the flowing temperature of the conductive film, and when the temperature of the surface of the wafer is greater than or equal to the flowing temperature, the conductive film begins to flow. After the conductive film is formed, the temperature of the surface of the wafer is elevated to perform a reflowing process, thereby converting the conductive film to a conductive layer that fills up the opening.

In order to make the purpose, technical solutions and advantages of the present disclosure clearer, various examples of the present disclosure will be described below in combination with the drawings in detail. However, those of ordinary skill in the art can understand that, in various examples of the present disclosure, many technical details are proposed to make readers to understand the present disclosure better. However, the technical solutions claimed by the present disclosure can also be implemented even without these technical details and various variations and modifications made based on the following examples.

Figure 5:
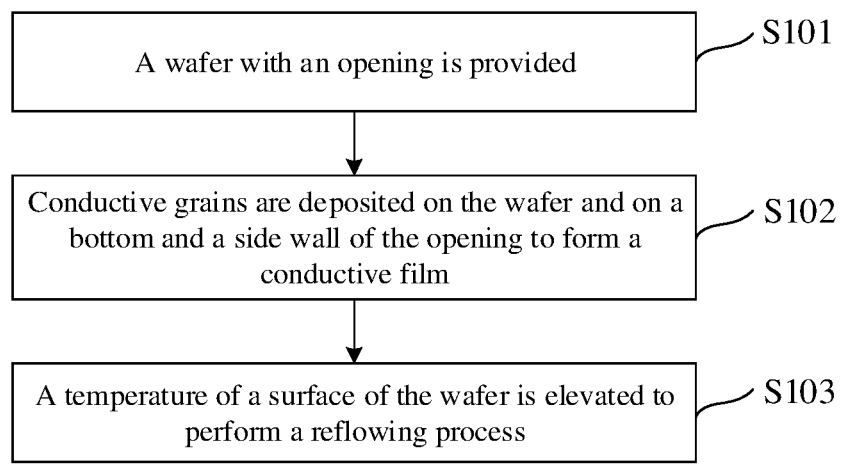
FIG. 5 is a flow chart of a method for manufacturing a wire layer provided by an example of the present disclosure.

FIG. 5 is a flow chart of the method for manufacturing a wire layer provided by an example of the present disclosure. FIG. 6-FIG. 9 are schematic sectional structure diagrams corresponding to various steps of the method for manufacturing a wire layer provided by an example of the present disclosure. Referring to FIG. 5-FIG. 9, the method for manufacturing a wire layer is specifically as follows.

At S101, a wafer 21 having an opening is provided.

Figure 6:
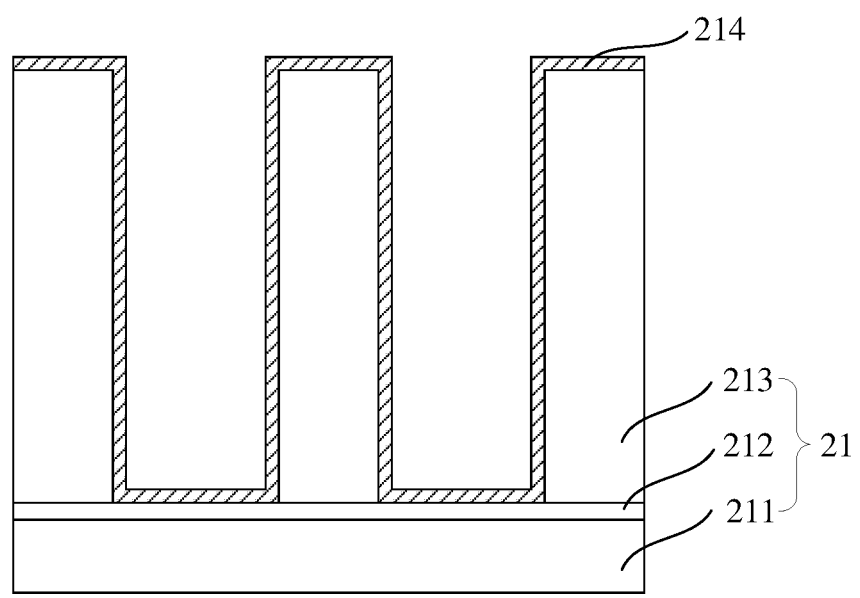
FIG. 6-FIG. 9 are schematic sectional structure diagrams corresponding to each of the steps of a method for manufacturing a wire layer provided by an example of the present disclosure.

Referring to FIG. 6, the wafer 21 includes a copper layer 211, a titanium nitride layer 212 and a silicon dioxide layer 213 which are sequentially stacked, and the titanium nitride layer 212 serves to isolate the copper layer 211 from the silicon dioxide layer 213, thereby preventing copper ions from penetrating into the silicon dioxide layer 213, and ensuring that the silicon dioxide layer 213 has preset performances.

In addition, in the example, the surface of the wafer 21 for depositing the conductive grains, namely, the upper surface of the wafer 21, and the surface of the bottom and the side wall of the opening, are covered with the isolation layer 214, and the subsequently deposited conductive grains fall on the surface of the isolation layer 214 to form the conductive film. The material of the isolation layer 214 includes titanium, titanium nitride, tantalum or tantalum nitride, and serves to isolate a subsequently deposited metal material from the silicon dioxide layer 213, thereby preventing metal ions from penetrating into the silicon dioxide layer 213 to influence the performance of the wafer 21.

In the example, the thickness of the isolation layer 214 is 5 nm-50 nm, for example, 10 nm, 20 nm or 40 nm. In such a manner, it is advantageous to ensure the isolation between the subsequently deposited metal material and the silicon dioxide layer 213, and the structure size of the wire layer can meet preset requirements.

At S102, the conductive grains are deposited on the wafer 21, and on the bottom and the side wall of the opening to form the conductive film 22.

Figure 7:
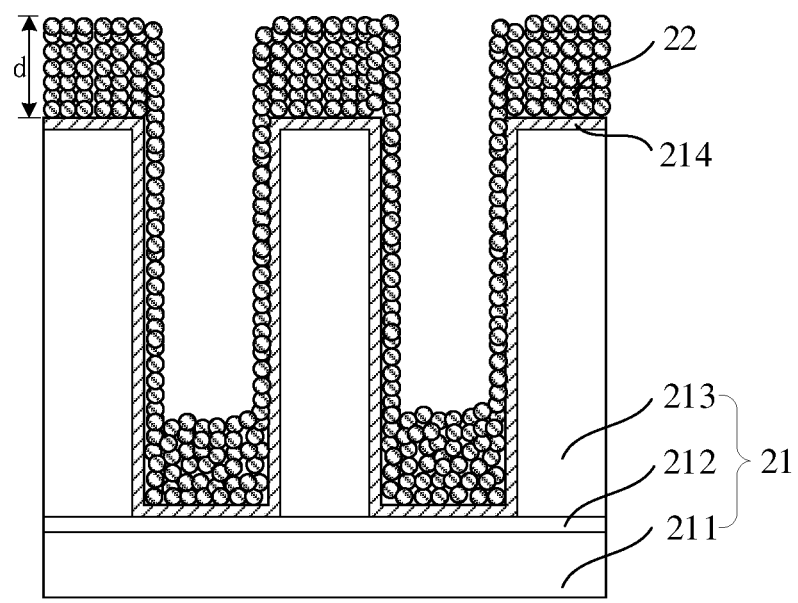

Referring to FIG. 7, in the procedure of depositing the conductive grains to form the conductive film 22, the temperature of the surface of the wafer 21 is lower than the flowing temperature of the conductive film 22, and when the temperature of the surface of the wafer 21 is greater than or equal to the flowing temperature, the conductive film 22 starts to flow. In such a manner, since the cold aluminum deposition is omitted, the wire layer can be manufactured only in one reaction chamber, which is advantageous to improve the production efficiency and reduce the cost.

The operation that conductive grains are deposited on the wafer 21 specifically includes the following steps. The wafer 21 and a conductive target material are placed in the reaction chamber. A sputtering gas is introduced into the reaction chamber and a direct-current power supply is turned on to ionize the sputtering gas into plasmas, and the plasmas impact the conductive target material to sputter the conductive grains. The conductive grains are deposited on the surface of the wafer 21. Since the wafer 21 is at an unheated normal temperature, the size of the conductive grains deposited on the surface of the wafer 21 is small, in such a manner, the mutual squeezing between the conductive grains can be effectively reduced, thus the generation of grain defects can be reduced. In addition, it is advantageous to improve the efficiency of the subsequent reflowing process.

The sputtering gas may be an inert gas, for example, argon.

Figure 10:
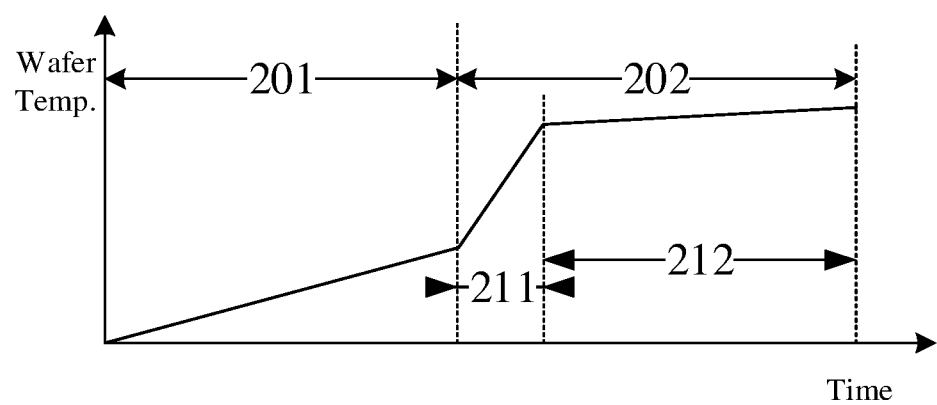
FIG. 10 is a wafer temperature variation diagram corresponding to a method for manufacturing a wire layer provided by an example of the present disclosure.

When the conductive grains are deposited on the surface of the wafer 21, the plasmas impact the wafer 21, thereby causing the temperature of the wafer 21 to rise. Referring to FIG. 10, the wafer temperature variation diagram includes a grain deposition stage 201 and a grain reflowing stage 202. In the grain deposition stage 201, the temperature of the wafer 21 is raised to some extent.

It is to be noted that the flow temperature of the conductive film 22 is related to a material of the conductive film 22. Taking aluminum as the material of the conductive film 22 as an example, the flowing temperature of the conductive film 22 is 330° C.-350° C., for example, 335° C., 340° C. or 345° C. In addition, since the surface of the wafer 21 is covered with the isolation layer 214, in the procedure of depositing the conductive grains to form the conductive film 22, the temperature of the surface of the isolation layer 214 is lower than the flowing temperature of the conductive film 22.

At S103, the temperature of the surface of the wafer 21 is elevated to perform the reflowing process.

Figure 8:
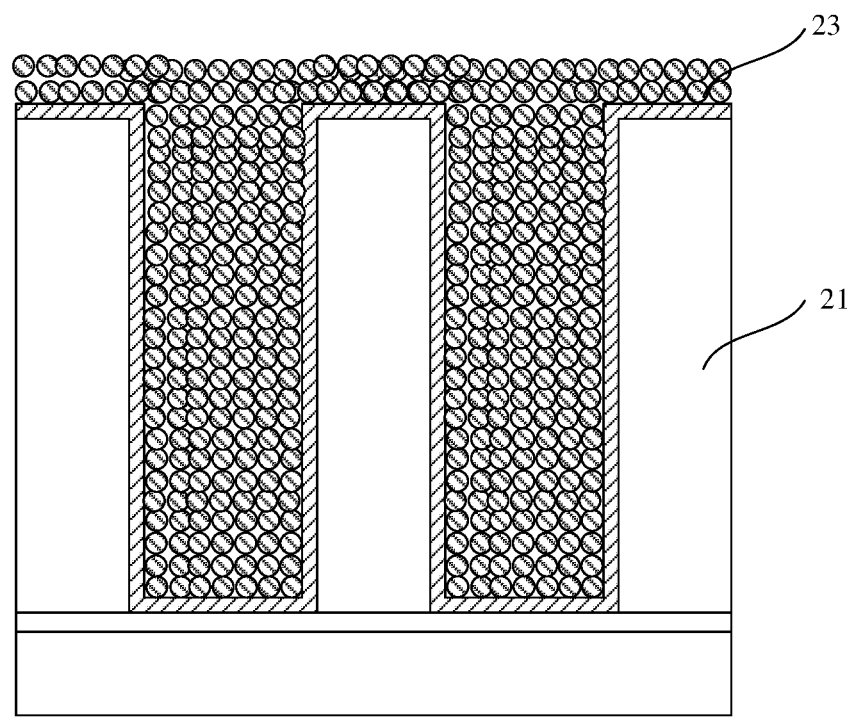

Referring to FIG. 8, after the conductive film is formed, the temperature of the reaction chamber is elevated, and a gas is introduced into the reaction chamber, and the flowing gas transfers the temperature of the reaction chamber to the surface of the wafer 21, so that the temperature of the wafer 21 is greater than or equal to the flowing temperature. That is, the conductive film 22 enters a molten state and starts to flow to the position where the opening is located, thereby converting the conductive film into a conductive layer 23 filling up the opening. In such a manner, in the reflowing procedure, only the reflowing temperature affects the size of the conductive grains. In the case of no plasma impact, the increase in the size of the conductive grains caused by the raised temperature of the wafer 21 is little, so that the generation of wafer defects can be reduced.

In the example, the flowing rate of the gas introduced into the reaction chamber is 2 sccm-10 sccm, for example, 4 sccm, 6 sccm or 8 sccm. In such a manner, the temperature of the surface of the wafer 21 can be rapidly and uniformly elevated to that in the reaction chamber.

In the example, the material of the conductive grains is aluminum. When the reflowing process is performed, the temperature of the reaction chamber (that is, the process temperature of the reflowing process) is 400° C.-450° C., for example, 410° C., 430° C. or 440° C. By using 400° C.-450° C. as the process temperature for the reflowing process, the aluminum can reflow better to fill a hole.

In the example, before performing the reflowing process, the thickness d of the conductive film 22 on the wafer 21 is 500 nm-750 nm, for example, 550 nm, 600 nm, 650 nm or 700 nm. Correspondingly, the gas is introduced for 60 s-120 s, for example 80s, 90 s or 100 s. In such a manner, it is advantageous to ensure that the conductive film 22 can sufficiently reflow to avoid defects of the grains such as edge protrusions and the like caused by insufficient reflowing.

In the example, in the case that the gas is continuously introduced, the temperature of the reaction chamber is elevated to a first preset temperature, and then the temperature of the reaction chamber is lowered to a second preset temperature. The first preset temperature is greater than the second preset temperature, and both the first preset temperature and the second preset temperature are greater than the flowing temperature, in which the second preset temperature is the process temperature of the reflowing process. In such a manner, it is advantageous to reduce the time of the reflowing process.

Referring to FIG. 10, the gain reflowing stage 202 includes a first reflowing stage 211 and a second reflowing stage 212. In the first reflowing stage 211, the temperature of the reaction chamber is at a first preset temperature. In the second reflowing stage 212, the temperature of the reaction chamber is at a second preset temperature.

Figure 9:
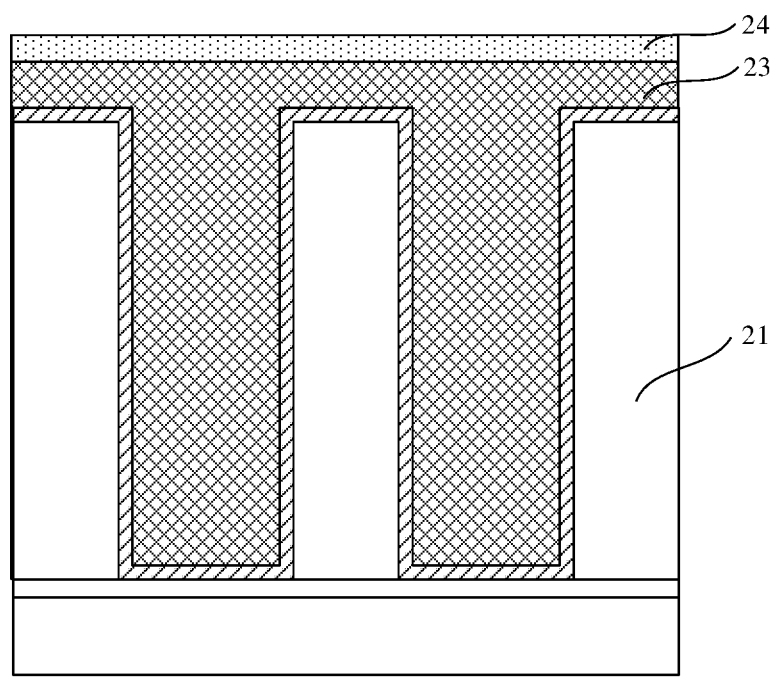

Referring to FIG. 9, after the reflowing process is finished, an anti-reflection layer 24 is formed, which covers the surface of the conductive layer 23 that is away from the wafer 21. The material of the anti-reflection layer 24 includes titanium nitride. Since titanium nitride has a relatively low reflectivity, in such a manner, it is advantageous to improve the resolution of photolithography in a metal patterning procedure.

In the example, the thickness of the anti-reflection layer 24 is 10 nm-50 nm, for example 20 nm, 30 nm or 40 nm.

In the example, the reflowing process is performed after the conductive film 22 is formed, therefore the temperature of the wafer 21 is relatively low in the procedure of depositing the conductive grains, and there is no plasmas impact in the reflowing procedure of the conductive film 22, which results in the small size of the deposited conductive grains, thereby reducing defects such as the edge protrusion caused by the mutual squeeze between the conductive grains.

Those of ordinary skill in the art may understand that each implementation mode is a specific example implementing the disclosure, and in practical disclosures, various variations about the form and details may be made thereto without departing from the spirit and scope of the disclosure. Any person skilled in the art can make various changes and modifications without departing from the spirit and scope of the present disclosure, and therefore the scope of protection of the present disclosure should be determined by the scope of the claims.

The invention claimed is:

1. A method for manufacturing a wire layer, comprising:
providing a wafer having an opening;
depositing conductive grains on the wafer, and on a bottom and a side wall of the opening to form a conductive film, wherein during depositing the conductive grains, a temperature of a surface of the wafer is lower than a flowing temperature of the conductive film, and when the temperature of the surface of the wafer is higher than or equal to the flowing temperature, the conductive film starts to flow; wherein depositing the conductive grains on the wafer comprises: introducing a sputtering gas into a reaction chamber and turning on a direct-current power supply to enable the sputtering gas to form plasmas, impacting a conductive target material by the plasmas to sputter the conductive grains, and depositing the conductive grains on the wafer; and
elevating the temperature of the surface of the wafer to perform a reflowing process after the conductive film is formed, such that the conductive film is converted to a conductive layer filling up the opening.

2. The method of claim 1, wherein elevating the temperature of the surface of the wafer to perform the reflowing process comprises: elevating a temperature of the reaction chamber, and introducing a gas into the reaction chamber such that the temperature of the surface of the wafer is greater than or equal to the flowing temperature, wherein a flowing rate of the gas is 2 sccm-10 sccm.

3. The method of claim 2, wherein the flowing temperature is 330° C.-350° C., and a process temperature of the reflowing process is 400° C.-450° C.

4. The method of claim 3, wherein before performing the reflowing process, a thickness of the conductive film on the wafer is 500 nm-750 nm, and the gas is introduced for 60 s-120 s.

5. The method of claim 3, wherein a material of the conductive grains comprises aluminum.

6. The method of claim 2, wherein elevating the temperature of the reaction chamber comprises: elevating the temperature of the reaction chamber to a first preset temperature, and reducing the temperature of the reaction chamber to a second preset temperature, wherein the first preset temperature is greater than the second preset temperature, and the first preset temperature and the second preset temperature are greater than the flowing temperature.

7. The method of claim 1, wherein providing the wafer having the opening comprises: providing the wafer having the opening, in which the surface of the wafer for depositing the conductive grains is covered with an isolation layer; and depositing the conductive grains on a surface of the isolation layer to form the conductive film, wherein a material of the isolation layer comprises titanium, titanium nitride, tantalum or tantalum nitride.

8. The method of claim 7, wherein a thickness of the isolation layer is 5 nm-50 nm.

9. The method of claim 1, wherein after the reflowing process is performed, forming an anti-reflection layer covering a surface of the conductive layer away from the wafer.

10. The method of claim 9, wherein a material of the anti-reflection layer comprises titanium nitride, and a thickness of the anti-reflection layer is 10 nm-50 nm.

11. A method for manufacturing a wire layer, comprising:
providing a wafer having an opening;

depositing conductive grains on the wafer, and on a bottom and a side wall of the opening to form a conductive film, wherein during depositing the conductive grains, a temperature of a surface of the wafer is lower than a flowing temperature of the conductive film, and when the temperature of the surface of the wafer is higher than or equal to the flowing temperature, the conductive film starts to flow; and elevating the temperature of the surface of the wafer to perform a reflowing process after the conductive film is formed, such that the conductive film is converted to a conductive layer filling up the opening, wherein elevating the temperature of the surface of the wafer to perform the reflowing process comprises: elevating a temperature of a reaction chamber, and introducing a gas into the reaction chamber such that the temperature of the surface of the wafer is greater than or equal to the flowing temperature, wherein a flowing rate of the gas is 2 sccm-10 sccm.

12. The method of claim 11, wherein the flowing temperature is 330° C.-350° C., and a process temperature of the reflowing process is 400° C.-450° C.

13. The method of claim 12, wherein before performing the reflowing process, a thickness of the conductive film on the wafer is 500 nm-750 nm, and the gas is introduced for 60 s-120 s.

14. The method of claim 13, wherein a material of the conductive grains comprises aluminum.

15. The method of claim 11, wherein elevating the temperature of the reaction chamber comprises: elevating the temperature of the reaction chamber to a first preset temperature, and reducing the temperature of the reaction chamber to a second preset temperature, wherein the first preset temperature is greater than the second preset temperature, and the first preset temperature and the second preset temperature are greater than the flowing temperature.

* * * * *